(12) United States Patent
Pichler

(10) Patent No.: US 6,635,990 B1
(45) Date of Patent: Oct. 21, 2003

(54) DISPLAY DEVICE WITH PRIMARY AND SECONDARY LIGHT-EMISSIVE REGIONS

(75) Inventor: Karl Pichler, Wappingers Falls, NY (US)

(73) Assignee: Cambridge Display Technologies, Cambridge (GB)

( * ) Notice: Subject to any disclaimer, the term of this patent is extended or adjusted under 35 U.S.C. 154(b) by 0 days.

(21) Appl. No.: 09/333,359

(22) Filed: Jun. 15, 1999

(30) Foreign Application Priority Data

Jun. 19, 1998 (GB) ............................................. 9813324

(51) Int. Cl.[7] .......................... H01J 31/50; H01J 40/18
(52) U.S. Cl. ...................... 313/527; 313/504; 313/506; 313/507
(58) Field of Search .............................. 313/527, 504, 313/506, 507, 543

(56) References Cited

U.S. PATENT DOCUMENTS

| | | | | |
|---|---|---|---|---|
| 3,603,828 A | * | 9/1971 | Sheldon ....................... 313/527 |
| 4,024,390 A | * | 5/1977 | Bosserman et al. ... 250/214 VT |
| 4,024,391 A | * | 5/1977 | Bosserman et al. ... 250/214 VT |
| 4,069,438 A | * | 1/1978 | Houston et al. ......... 313/346 R |
| 4,093,562 A | * | 6/1978 | Kishimoto .................. 252/511 |
| 4,184,069 A | | 1/1980 | Bosserman ................. 250/213 |
| 4,236,096 A | | 11/1980 | Tiemann ........................ 313/1 |
| 4,482,841 A | * | 11/1984 | Tiku et al. ................... 313/503 |
| 4,539,507 A | * | 9/1985 | VanSlyke et al. ........... 313/504 |
| 5,099,301 A | * | 3/1992 | Kikinis ........................ 257/379 |
| 5,247,190 A | * | 9/1993 | Friend et al. .................. 257/40 |
| 5,457,356 A | * | 10/1995 | Parodos ....................... 313/505 |
| 5,543,862 A | * | 8/1996 | Culkin ......................... 348/739 |
| 5,572,087 A | * | 11/1996 | Vrijssen ....................... 313/479 |
| 5,612,712 A | * | 3/1997 | Kumar et al. ............... 345/75.2 |
| 6,091,194 A | * | 7/2000 | Swirbel et al. ............. 313/498 |
| 6,275,270 B1 | * | 8/2001 | Culkin ........................ 348/739 |

FOREIGN PATENT DOCUMENTS

| | | |
|---|---|---|
| DE | 19700262 A1 | 7/1998 |
| NL | 1007020 | 3/1999 |
| WO | WO 90/13148 | 11/1990 |
| WO | WO 98/06217 | 2/1998 |

OTHER PUBLICATIONS

Dodabalapur et al., "Microcavity Effects In Organic Semiconductors," Appl. Phys. Lett. 64 (19), May 9, 1994, pp. 2486–2488.*

B. Culkin, "Photocathode Displays," Information Display, 1997, pp. 14–17, XP002114937.

Brad Culkin, "Photocathode Displays," Information Display 8/97, pp. 14–17, 1997.

(List continued on next page.)

*Primary Examiner*—Vip Patel
*Assistant Examiner*—Kevin Quarterman
(74) *Attorney, Agent, or Firm*—Finnegan, Henderson, Farabow, Garrett & Dunner, LLP

(57) ABSTRACT

A display device comprising a primary light-emissive region, a light-sensitive region and a secondary light-emissive region, wherein: the primary light-emissive region comprises an organic light-emissive material and a pair of electrodes arranged to apply an electric field across the light-emissive material to cause it to emit light; the light-sensitive region comprises a photocathode responsive to light from the primary light-emissive region to release charged particles towards the secondary light-emissive region; sand the secondary light-emissive region comprises a phosphorescent material excitable by the charged particles from the light-sensitive region to emit light.

19 Claims, 2 Drawing Sheets

OTHER PUBLICATIONS

Wittmann et al., "Communications: Microcavity Effect in a Single–Layer Polymer Light–Emitting Diode," Advanced Materials 1995, vol. 7, No. 6, pp.541–544, 1995.

Tsutsui et al., "Shapely Directed Emission In Organic Electroluminescent Diodes Wtih An Optical–Microcavity Structure" Appl. Phys. Lett. 65 (15) Oct. 10, 1994, pp. 1868–1870.

Jordan et al., "Efficiency Enhancement of Microcavity Organic Light Emitting Diodes," Appl. Phys. Lett. 69 (14), Sep. 30, 1996, pp. 1997–1999.

Grüner et al., "Emissions Enhancement In Single–Layer Conjugated Polymer Microcavitities," J. Appl. Phys. 80 (1), Jul. 1, 1996, pp. 207–215.

* cited by examiner

DISPLAY DEVICE WITH PRIMARY AND SECONDARY LIGHT-EMISSIVE REGIONS

BACKGROUND OF THE INVENTION

This invention relates to light-emissive devices, especially devices of the photocathode type which can be used as, for example, display devices One type of photocathode display is described in 'Photocathode Displays', Information Display, Vol. 13, No. 8, 1997, Society for Information Display. In this type of display a monochrome thick-film flat-panel inorganic electroluminescent (EL) dot-matrix display 1 (see FIG. 1) is used to project an image on to a diode intensifier 2. The diode intensifier comprises a pair of parallel glass plates 3, 4 with a high vacuum in a thin chamber 5 defined between them. The rear glass plate 3 has a metal coating 6 on its inner surface (the surface facing the vacuum) to act as a photocathode. The front plate has a phosphor coating 7 on its inner surface. A high positive voltage (e.g. 10 kV) is applied to the phosphor 7 relative to the photocathode 6. Where light from the display 1 hits the photocathode 6 it causes the emission of electrons, which are accelerated by the high voltage towards, the phosphor 7. The electrons strike the phosphor and excite it to emit light (see arrow 8) towards a viewer 9. To make a full colour display the front plate can be coated with a pattern of red, green and blue (RGB) phosphor dots which can each be excited by means of the display 1.

This display has some advantages over other display technologies. However, it also has significant problems. One of the key problems is that the operation of the thick-film inorganic EL device requires very high AC drive voltage signals, often in excess of 100 V. This means that the display drive electronics are expensive and difficult to implement because they must be able to process and output display image data at high frequency and high voltage. In addition, the thick-film inorganic EL displays are also relatively inefficient.

There is a therefore a need for a device in which these problems may be at least partially overcome.

SUMMARY OF THE INVENTION

According to the present invention there is provided a display device comprising a primary light-emissive region, a light-sensitive region and a secondary light-emissive region, wherein: the primary light-emissive region comprises an organic light-emissive material and a pair of electrodes arranged to apply an electric field across the light-emissive material to cause it to emit light; the light-sensitive region comprises a photocathode responsive to light from the primary light-emissive region to release charged particles towards the secondary light-emissive region; and the secondary light-emissive region comprises a phosphorescent material excitable by the charged particles from the light-sensitive region to emit light.

Preferably the light-sensitive region and the secondary light-emissive region are operable to intensify light emitted from the primary light-emissive region. This may be achieved by the application of a suitable voltage between the photocathode and the phosphorescent material. The voltage is suitably such as to negatively bias the photocathode relative to the phosphorescent material. The charged particles are suitably negatively charged particles such as electrons.

The display device preferably comprises a plurality of primary light-emissive regions arranged in a planar array. These preferably either all lie behind the light-sensitive region and secondary light-emissive region, both of which then are preferably planar, or lie behind a respective light-sensitive region and a respective secondary light-emissive region, in which case those secondary light-emissive regions may provide different emission colours—most preferably red, green and blue. Each primary light-emissive region is preferably independently controllable by means of its electrodes. On one side of the planar array the electrodes of the primary light-emissive regions are preferably electrically connected in a first, row direction (and electrically separate in a second, column direction). On the other side of the planar array the primary light-emissive regions are preferably electrically connected in the column direction (and electrically separate in the row direction). The row and column directions are preferably (but not necessarily) orthogonal or substantially orthogonal. The row and column directions suitably correspond to the directions of rows and columns of pixels in the display device. Each primary light-emissive region may correspond to a pixel (suitably in a monochrome device) or to one colour sub-unit of a pixel (suitably in a multi-colour device). The electrodes of the primary light-emissive regions are preferably in a passive matrix arrangement, although an active matrix or another arrangement may be used. An active matrix device may use thin-film transistor (TFT) circuitry integrated with the light-emissive region. The TFT circuitry may be embodied in, e.g., poly-crystalline or amorphous silicon.

The secondary light-emissive region may comprise a plurality of phosphorescent areas. Each of these areas may comprise one of a number of phosphorescent materials. Preferably, each area comprises either a red- or green- or blue-light-emissive material. Where there is more than one primary light-emissive region each phosphorescent area preferably overlies a single one of the primary light-emissive regions.

The thickness of the light-emissive material is preferably such as to spatially redirect light to be emitted from the or each primary light-emissive region, preferably to narrow the emission cone and most preferably to redirect it directly towards the light-sensitive region and/or perpendicular to the plane (if any) of the primary light-emissive region(s). The or each primary light-emissive region may comprise either an interference or a microcavity structure for spatially redirecting light to be emitted from the region, preferably narrowing the light cone.

The or each primary light-emissive region may comprise means for altering the colour of the light emitted from that region, preferably to narrow the emission spectrum in order to narrow the energy spread of photoelectrons emitted from the light-sensitive region. One means for achieving this is a colour filter. A preferred alternative is an interference or a microcavity structure for spectrally redistributing (suitably selecting and/or narrowing) the light to be emitted from the region.

Preferably at least one of the electrodes is light-transmissive. That is preferably the electrode closer to the light-sensitive region. It is preferably the anode, but it could alternatively be the cathode.

The device preferably comprises a display driver for applying a voltage between the electrodes of each primary light-emissive region to cause it to emit light. The voltage is preferably less than 20V and most preferably less than 10V. The display driver is preferably a passive matrix display driver and is preferably connected to row and column electrodes of the device for applying a passive matrix drive scheme. The display driver may drive each primary light-emissive region to emit only at (for example) 5 Cd/m² or less.

To achieve grey scales the display driver may drive the or each primary light-emissive region in a pulse-width modulated format and/or a time-division multiplexed format and/or an amplitude modulated format.

The display device may be a monochrome, bi-chrome or multi-colour display, as determined by the output colours of the secondary light-emissive region(s). The display device may be used as the display of an electronics product, and a second aspect of the present invention provides an electronics product comprising such a display device. Other uses include colour converters (for converting the light colour emitted by the primary light-emissive region(s)) or image intensifiers.

The device is preferably arranged so that light from the primary light-emissive region does not (or substantially does not) escape the display device (other than indirectly, via conversion to charged particle release by means of the light-sensitive region).

Some preferred materials for the device are as follows:

One of the electrodes (the anode, or hole injecting electrode) preferably has a work function of greater than 4.3 eV. That layer may suitably comprise ITO or tin oxide. The other electrode (the cathode, or electron injecting layer) preferably has a work function less than 3.5 eV. That layer may suitably comprise calcium, lithium, samarium, ytterbium, terbium, barium or an alloy comprising one or more of those metals with or without another metal such as aluminium. At least one of the electrode layers is suitably light-transmissive, and preferably transparent, suitably at the frequency of light emission from the primary light-emissive device.

The light-emissive material may comprise a single light-emissive component or more than one. Suitably the or each light-emissive component is an organic material, preferably a polymer and most preferably a conjugated or partially conjugated polymer. Some appropriate materials include poly(p-phenytenevinylene) ("PPV"), poly(2-methoxy-5-(2'-ethyl)hexyloxyphenylene-vinylene) ("MEH-PPV"), a PPV-derivative (e.g. a di-alkoxy or di-alkyl derivative), a polyfluorene, poly (2,7-(9,9-di-n-octylfluorene)-(1,4-phenylene-((4-secbutylphenyl)imino)-1, 4-phenyl ("TF B"), poly(2,7-(9,9-di-n-octylfluorene)-(1,4-phenylene-((4-methylphenyl)imino)-1,4-phenylene-((4-methylphenyl)imino)-1,4-phenylene)) ("PFM"), poly (2,7-(9,9-di-n-octylfluorene) (1,4-phenylene-((4-methoxyphenyl)imino)-1,4-phenylene-((4-methoxyphenyl) imino)-1,4-phenylene)) ("PFMO"), poly (2,7-(9,9-di-n-octylfluorene) ("F8") or (2,7-(9,9-di-n-octylfluorene)-3,6-Benzothiadiazole) ("F8BT") and/or a copolymer incorporating polyfluorene segments, PPVs and/or related co-polymers. Alternative materials include organic molecular light-emitting materials, e.g. Alq3, or any other small sublimed or solution processed molecule or conjugated polymer electroluminescent material as known in the prior art.

There may be one or more charge transport layers between either or both of the electrodes of the primary light-emissive device and the light-emissive material. The transport layer may suitably comprise one or more polymers such as poly(styrenesulphonic acid) doped poly (ethylenedioxythiophene) ("PEDOT/PSS") and/or poly(2,7-(9,9-di-n-octylfluorene)-(1,4-phenylene-(4-imino(benzoic acid))-1,4-phenylene-(4-imino(benzoic acid))-1,4-phenylene)) ("BFA") and/or polyaniline (doped, undoped or partially doped) and/or PPV.

BRIEF DESCRIPTION OF THE DRAWINGS

The present invention will now be described by way of example with reference to the accompanying drawings, in which.

DETAILED DESCRIPTION OF THE PREFERRED EMBODIMENTS

Figure 1:
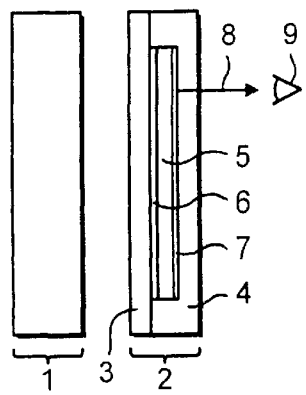
FIG. 1 is a side view of a prior art photocathode display.
Figure 2:
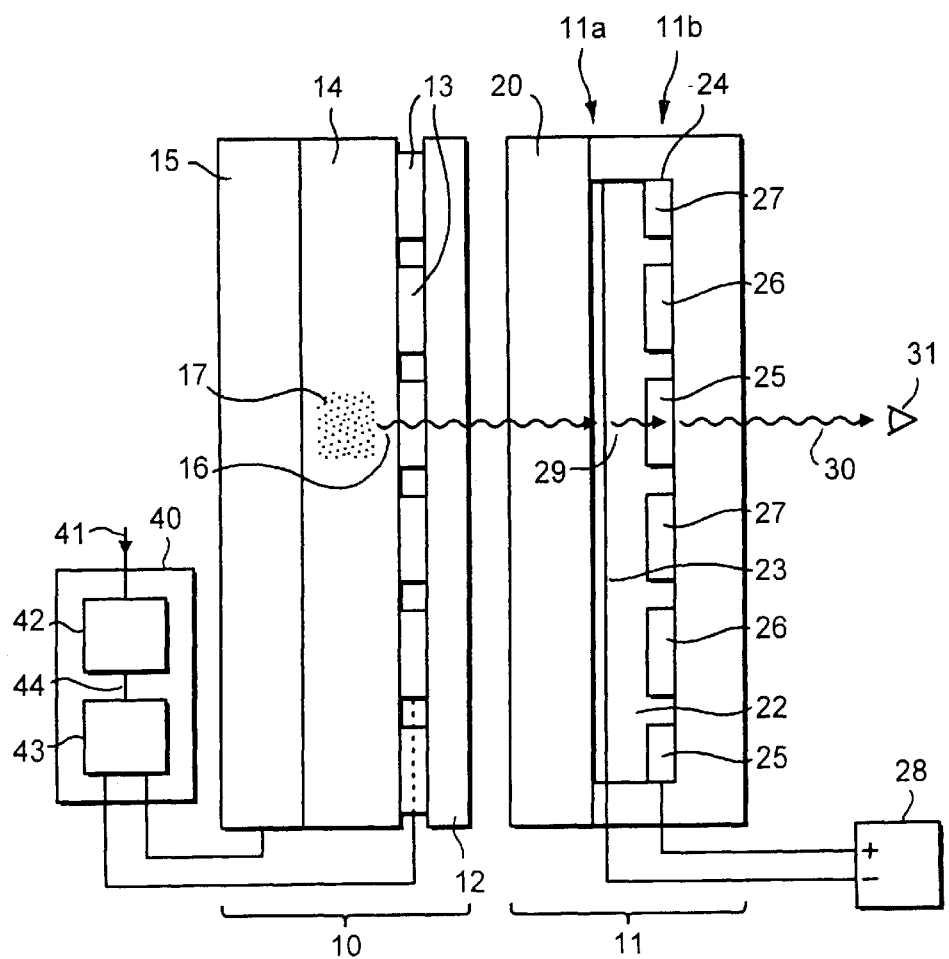
FIG. 2 is a schematic cross-sectional view of a multi-colour display device.

FIG. 2 shows a display device having a light-emissive panel 10 and a photocathode display panel (PCD) 11 including a light-sensitive zone 11a and a secondary light-emissive zone 11b. The light-emissive panel 10 employs an organic material 14 for light emission.

Devices in which an organic material is used for light emission are described in PCT/WO90/13148 and U.S. Pat, No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes recombine in the organic layer generating photons. In PCT/WO90/13148 the organic light-emissive material is a polymer. In U.S. Pat No. 4,539,507 the organic light-emissive material is of the class known as small molecule materials, such as tris-(8-hydroxyquinolino) aluminium ("Alq3"). In a practical device, one of the electrodes is typically transparent, to allow the photons to escape the device.

The light-emissive panel 10 of FIG. 2 comprises a glass substrate 12 on which there is a layer consisting of a series of parallel linear anode electrodes 13 of transparent indium-tin oxide (ITO). This structure can be formed by patterning (e.g. by photolithography) a commercially available glass-ITO unit. Over the glass-ITO unit is a layer 14 of organic light-emissive material such as PPV which could be deposited by, for instance, spin coating from solution. Over the PPV is a layer consisting of a series of parallel linear cathode electrodes 15 which comprises a thin layer of calcium adjacent the PPV and a thicker backing layer of aluminium. The cathode electrodes run perpendicular to the anode electrodes so that each region of PPV where an anode electrode and a cathode electrode overlap can be addressed individually by applying a drive voltage between those electrodes. The light-emissive panel therefore comprises a series of pixels that can be individually addressed by means of a normal passive matrix scheme. (By adding the necessary circuitry—for example an array of thin-film transistor drive circuits—the device could be addressed in an active matrix scheme).

Light emitted by each pixel passes through the appropriate anode electrode 13 and the glass substrate 14 towards the photocathode display panel 11, as indicated generally by arrow 16 for the light from pixel 17. The photocathode display comprises a pair of glass sheets 20, 21 which define a thin chamber 22. The chamber 22 is evacuated to a high vacuum. The rear glass plate 20 has a coating 23 of metal (or more generally a material capable of emitting electrons upon excitation by light, with or without the application of an electric field) on its inner surface (the surface facing the vacuum) to act as a photocathode. Examples of suitable materials for the photocathode include low work function compounds, low work function metals, low electron affinity materials and diamond-like films as generally known. The front plate has a phosphor coating (indicated generally at 24) on its inner surface, which is made up of an array of regions of red-emissive phosphor 25, green-emissive phosphor 26 or blue-emissive phosphor 27. The phosphor regions are located so as to correspond to the locations of the pixels of the light-emissive panel 10. Each pixel of the light-emissive panel, defined by the overlap of one anode and one cathode electrode, underlies one phosphor region.

A high positive voltage (e.g. 10kv) is applied to an electrode (not shown) adjacent to the phosphor regions 25, 26, 27 relative to the photocathode 23, by means of a high voltage supply unit 28 whose connections are shown only schematically in FIG. 2. Where light from the light-emissive panel 10 hits the photocathode 23 it emits electrons (shown generally by arrow 29, for example) which are accelerated by the high voltage towards the phosphor coating 24. The electrons strike the phosphor and excite it to emit light (shown generally by arrow 30) towards a viewer 31. The colour of the light emitted towards the viewer is determined by the type of phosphor region that emits it. Different phosphor material are used to provide the red, green and blue light emission.

To operate the device a display driver 40 is connected to receive a video data input signal at 41. The display driver comprises a separation unit 42 and a display control unit 43. The video data signal is split into red, green and blue components by the separation unit 42, which provides a resultant split video signal at 44 to the display control unit 43. The display control unit is connected individually to each anode and cathode electrode of the light-emissive panel (the connections are shown schematically in FIG. 2), and scans the anode "row" electrodes whilst activating the appropriate cathode "column" electrodes to cause selected pixels to emit and thereby generate emission from the corresponding phosphorescent regions.

Figure 3:
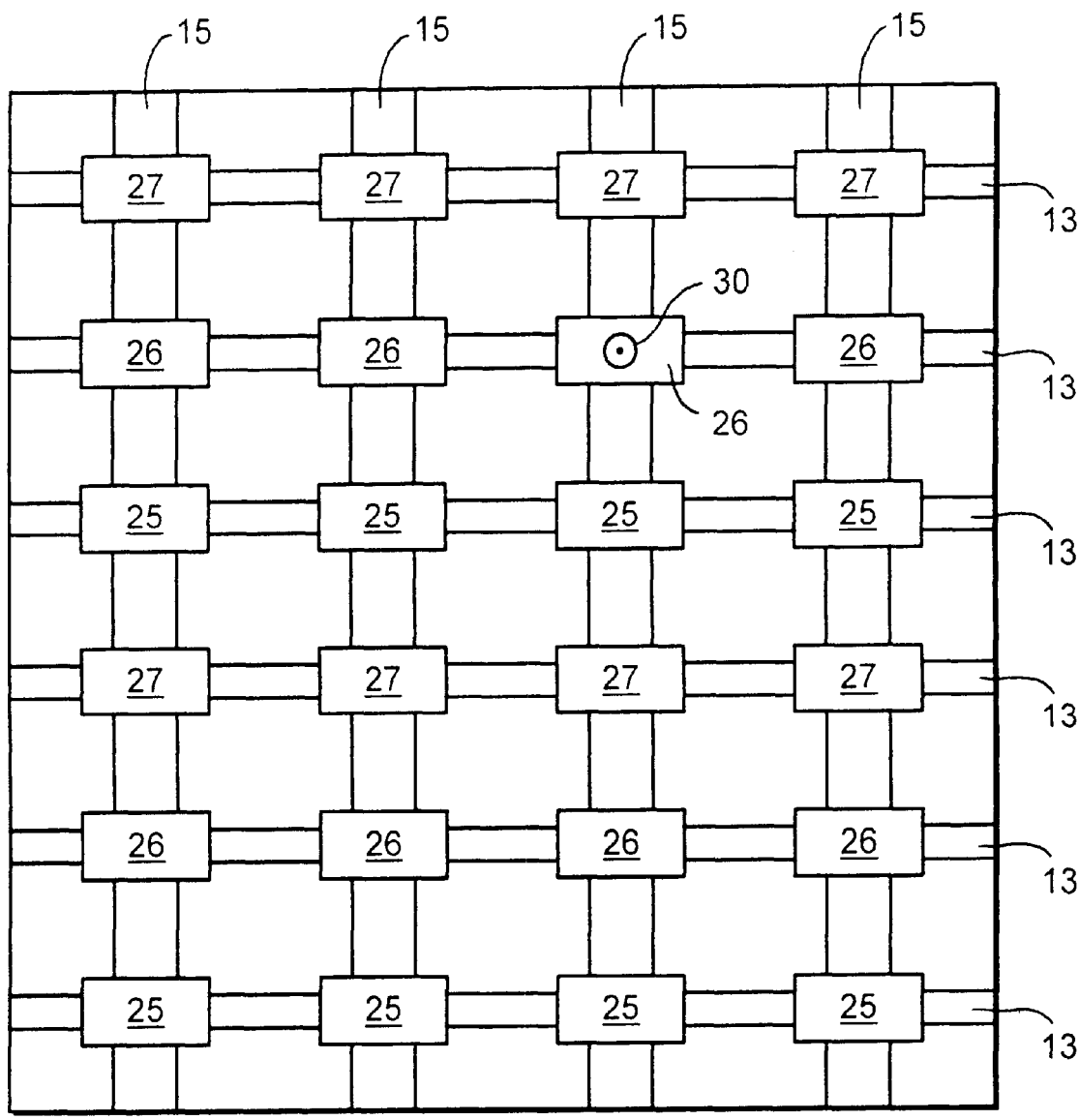
FIG. 3 is a schematic plan view of the device of FIG. 2. The figures do not show the device to scale.

The photocathode display panel 11 acts to intensify the light supplied to it from the light-emissive panel 10. This allows for a significant advantage of the device of FIGS. 2 and 3 over prior art devices. In a passive matrix display device each pixel emits for only a moment before the next row of the display is addressed. To cope with this, in a conventional passive matrix display device the instantaneous brightness of an emitting pixel must be relatively high. This causes problems in building electrodes that can supply the high peak currents that are needed, and the high through-currents can cause premature degradation of the emissive material. In the device of FIGS. 2 and 3 there is no need for the emissive panel to operate with high brightness because of the light-intensifying effect of the photocathode panel. A suitable maximum brightness for each pixel of the light-emissive panel is around $5Cd/m^2$ or less. This allows the device to benefit from the reduced cost of implementing a passive matrix addressing system compared to active matrix system.

Two additional issues are: (a) the possibility of spatial spreading of the light that is emitted from the emitting pixels, which could lead to waveguiding in the glass substrate, reducing display contrast; and (b) the possibility of spectral spread of the light from the pixels because the emission spectrum of organic electroluminescent devices is typically broad. These issues can be addressed by the construction of so-called "microcavity" or "interference" devices. Such devices allow a narrow emission cone and a highly concentrated emission spectrum to be generated by spectrally redistributing (narrowing) and/or spatially redirecting (narrowing) the light. The narrow emission cone reduces the risk of unwanted waveguiding in the plane of the display. This also reduces the risk of internal reflections, e.g. total internal reflection. The concentrated emission spectrum allows the emission to be made more uniform (improving grey-scale performance by narrowing the energy distribution of the photoelectrons emitted from the photocathode) and allows the emission colour to be tailored to the wavelengths to which the photocathode is more sensitive—i.e. its photoelectron efficiency is greater. The principles behind such microcavity or interference devices are described in, for example, H. F. Wittmann et al., Advanced Materials Vol. 7, No. 6 (1995) pp 541–544, A. Dodabalapur et al., Appl. Phys. Lett. Vol. 64, No. 19 (1994) pp 2486–2488, T. Tsutsui et al., Appl. Phys. Lett. Vol. 65, No. 15 (1994) pp 1868–1870, R. H. Jordan et al., Appl. Phys. Lett. Vol. 69, No. 14 (1997) pp 1997–1999 and J. Gruner et al., J. Appi. Phys. Vol. 80, No. 1 (1996) pp 207–215. The generally uniform layered structure of organic light-emissive devices means that microcavity structures can be relatively easily constructed around them, even incorporating layers of the emissive structure (such as the emissive layer itself) in the microcavity, e.g. by defining a simple microcavity|interference structure by simply choosing an appropriate thickness for the organic layer(s). This makes for an especially simple structure. It should be noted that it is not practical, and perhaps not even possible, to implement a microcavity device in a prior art thick film device because of the inherent non-uniformity of thickness in such devices or, e.g. the refractive indices of the materials employed there.

An alternative to a microcavity for redirecting the light from the light-emissive panel is to provide thin spacer sheets between the OLED and the photocathode material. An alternative for altering the emission colour is an absorptive and/or fluorescent filter layer, or the light-emissive material itself could be chosen carefully to give emission of the desired colour.

The electrodes of the light-emissive panel could be reversed, if suitable materials were chosen, so that the light is emitted through the cathode. In that case the material of the cathode should be chosen to be light-transmissive.

To improve current flow and charge uniformity along the electrode strips, especially those of a light-transmissive electrode, there could be additional metallisation adjacent to the strips (suitably on the side furthest from the light-emissive material).

To save space and/or to reduce internal reflection problems the glass layer 12 of the light-emissive panel could be omitted and the light-emissive panel could be deposited directly on to the outer surface of glass layer 20. Any of the glass layers could be replaced with layers of other materials, for example light-transmissive plastics materials. The order of deposition of the light-emissive panel could be reversed, so that the glass substrate 12 is on the side of the panel furthest from the photocathode panel, with the light emission through electrodes 15. In that case a further layer of insulating material could be deposited over the final electrodes 15 of the light-emissive panel. (The electrodes 15 would be transparent). That layer of insulating material could replace the glass layer 20 and could have the photocathode layer 23 deposited on to it.

The light-emissive panel 10 and the photocathode panel 11 could be prefabricated units that are laminated together to produce the device of FIGS. 2 and 3.

To achieve grey scales the display driver may drive the or each primary light-emissive region in a pulse-width modulated format and/or a time-division multiplexed format and/or an amplitude modulated format.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

What is claimed is:

1. A display device comprising a primary light-emissive region, a light-sensitive region, a secondary light-emissive region and a display driver, wherein:
   the primary light-emissive region comprises an organic light-emissive material and a pair of electrodes arranged to apply an electric field across the light-emissive material to cause it to emit light;
   the light-sensitive region comprises a photocathode responsive to light from the primary light-emissive region to release charged particles towards the secondary light-emissive region;
   the secondary light-emissive region comprises a phosphorescent material excitable by the charged particles from the light-sensitive region to emit light;
   the display driver is for applying a voltage between the electrodes of the primary light-emissive region to cause it to emit light; and
   the voltage is less than 10V.

2. A display device as claimed in claim 1, wherein the light-sensitive region and the secondary light-emissive region intensify light emitted from the primary light-emissive region.

3. A display device as claimed in claim 2, comprising a plurality of primary light-emissive regions arranged in a planar array.

4. A display device as claimed in claim 3, wherein on one side of the planar array the electrodes of the primary light-emissive regions are connected in a first, row direction and separate in a second, column direction, substantially orthogonal to the row direction and on the other side of the planar array the electrodes of the primary light-emissive regions are connected in the column direction and separate in the row direction.

5. A display device as claimed in claim 3, wherein the electrodes of the primary light-emissive regions are in a passive matrix arrangement.

6. A display device as claimed in claim 1, wherein the primary light-emissive region includes means for emitting substantially spectrally uniform light over the, whole of the primary light-emissive region.

7. A display device as claimed in claim 1, wherein the secondary light-emissive region includes means for emitting substantially spectrally non-uniform light over the whole of the secondary light-emissive region.

8. A display device as claimed in claim 1, wherein the secondary light-emissive region comprises a plurality of phosphorescent areas, each area comprising one of a plurality of phosphorescent materials.

9. A display device as claimed in claim 8, wherein each of the plurality of phosphorescent materials is emissive with a different colour from the others.

10. A display device as claimed in claim 9, comprising red-, green- and blue-emissive phosphorescent materials.

11. A display device as claimed in claim 8, comprising a plurality of primary light-emissive regions arranged in a planar array, and wherein each phosphorescent area overlies a single one of the primary light-emissive regions.

12. A display device as claimed in claim 1, wherein the primary light-emissive region is of an interference or microcavity structure for spatially and/or spectrally narrowing emission from that region.

13. A display device as claimed in claim 12, wherein the light-emissive material is located inside the interference or microcavity structure.

14. A display device as claimed in claim 13, wherein the properties of the interference or microcavity structure are predominantly determined by the light-emissive material.

15. A display device as claimed in claim 1, wherein the primary light-emissive region comprises a microcavity structure for spectrally redistributing and/or spatially redirecting light to be emitted from the region.

16. A display device as claimed in claim 1, wherein the light-emissive material is a polymer material.

17. A display device as claimed in claim 1, wherein at least one of the electrodes is light-transmissive.

18. An electronics product comprising a display device as claimed in claim 1.

19. A display device comprising a primary light-emissive region, a light-sensitive region, a secondary light-emissive region and a display driver, wherein:
   the primary light-emissive region comprises an organic polymer light-emissive material and a pair of electrodes arranged to apply an electric field across the light-emissive material to cause it to emit light;
   the light-sensitive region comprises a photocathode responsive to light from the primary light-emissive region to release charged particles towards the secondary light-emissive region;
   the secondary light-emissive region comprises a phosphorescent material excitable by the charged particles from the light-sensitive region to emit light;
   the display driver is for applying a voltage between the electrodes of the primary light-emissive region to cause it to emit light; and
   the voltage is less than 10V.

* * * * *

UNITED STATES PATENT AND TRADEMARK OFFICE
CERTIFICATE OF CORRECTION

PATENT NO.    : 6,635,990 B1  Page 1 of 1
DATED         : October 21, 2003
INVENTOR(S)   : Karl Pichler It is certified that error appears in the above-identified patent and that said Letters Patent is hereby corrected as shown below:

Title page,
Item [57], ABSTRACT,
Line 10, "sand" should read -- and --.
Item [73], Assignee, "Cambridge Display Technologies (GB)" should read
-- Cambridge Display Technology Limited (GB) --.

Column 7,
Line 55, "the, whole" should read -- the whole --.

Signed and Sealed this

Seventeenth Day of February, 2004

JON W. DUDAS
*Acting Director of the United States Patent and Trademark Office*